US012755930B2

(12) United States Patent
Murofushi et al.

(10) Patent No.: US 12,755,930 B2
(45) Date of Patent: Oct. 6, 2026

(54) CHARGED PARTICLE BEAM WRITING APPARATUS, DISCHARGE DETECTION METHOD, AND DISCHARGE DETECTION APPARATUS

(71) Applicant: NuFlare Technology, Inc., Yokohama (JP)

(72) Inventors: Tatsuya Murofushi, Gotenba (JP); Kuniaki Kawahara, Yokohama (JP); Yasuo Sengoku, Yokohama (JP); Ayako Tanaka, Kamakura (JP); Toru Ariizumi, Tama (JP)

(73) Assignee: NuFlare Technology, Inc., Yokohama (JP)

( * ) Notice: Subject to any disclaimer, the term of this patent is extended or adjusted under 35 U.S.C. 154(b) by 294 days.

(21) Appl. No.: 18/734,266

(22) Filed: Jun. 5, 2024

(65) Prior Publication Data

US 2025/0037969 A1 Jan. 30, 2025

(30) Foreign Application Priority Data

Jul. 24, 2023 (JP) ................................ 2023-120081

(51) Int. Cl.
*H01J 37/304* (2006.01)

(52) U.S. Cl.
CPC ................................ *H01J 37/304* (2013.01)

(58) Field of Classification Search
CPC .... H01J 37/304; H01J 37/244; H01J 37/3174; H01J 37/24; H01J 37/147;
(Continued)

(56) References Cited

U.S. PATENT DOCUMENTS 8,129,698 B2 3/2012 Nakayamada et al.
8,178,856 B2 5/2012 Nakayamada et al.
(Continued)

FOREIGN PATENT DOCUMENTS

JP 3-35929 A 2/1991
JP 4-333297 A 11/1992
(Continued)

OTHER PUBLICATIONS

Korean Office Action issued on Oct. 20, 2025 in Korean Patent Application No. 10-2024-0094145 (with English translation), 12 pages.
(Continued)

*Primary Examiner* — Kiet T Nguyen
(74) *Attorney, Agent, or Firm* — Oblon, McClelland, Maier & Neustadt, L.L.P.

(57) ABSTRACT

In one embodiment, a charged particle beam writing apparatus includes a high-voltage power supply configured to apply an acceleration voltage for charged particles to an emission unit, a deflector configured to deflect a charged particle beam emitted from the emission unit, a discharge sensor configured to output an output value indicating a change in a case where a discharge occurs in a column in which the emission unit and the deflector are arranged or in the high-voltage power supply, and a discharge detection control unit configured to convert the output value from the discharge sensor into a conversion value with the same sign, calculate an integral value of the conversion value over a fixed period of time, and determine, based on the integral value, whether or not a discharge that causes a pattern error has occurred.

14 Claims, 4 Drawing Sheets

(58) Field of Classification Search
CPC .... H01J 2237/0206; H01J 2237/24564; G01R 31/1218
USPC .......................................................... 250/492.22
See application file for complete search history.

(56) References Cited

U.S. PATENT DOCUMENTS

| | | | | |
|---|---|---|---|---|
| 2010/0057385 | A1* | 3/2010 | Iida .................... | H01M 10/482 702/58 |
| 2019/0043693 | A1 | 2/2019 | Matsumoto | |
| 2022/0319807 | A1* | 10/2022 | Nakayama ............ | H01J 37/045 |
| 2023/0028337 | A1 | 1/2023 | Ariizumi | |
| 2023/0064343 | A1 | 3/2023 | Murofushi et al. | |
| 2023/0102923 | A1 | 3/2023 | Nomura et al. | |

FOREIGN PATENT DOCUMENTS

| | | | |
|---|---|---|---|
| JP | 11-352178 | A | 12/1999 |
| JP | 2003-107122 | A | 4/2003 |
| JP | 2008-134060 | A | 6/2008 |
| JP | 2013-26421 | A | 2/2013 |
| JP | 2015-75482 | A | 4/2015 |
| JP | 2016-3989 | A | 1/2016 |
| JP | 2017-152341 | A | 8/2017 |
| JP | 2022-159786 | A | 10/2022 |
| JP | 2023-16379 | A | 2/2023 |
| JP | 2023-34881 | A | 3/2023 |
| TW | 201115614 | A1 | 5/2011 |
| TW | I379336 | B1 | 12/2012 |
| TW | 202209394 | A | 3/2022 |

OTHER PUBLICATIONS

Combined Taiwanese Office Action and Search Report issued May 5, 2025, in corresponding Taiwanese Patent Application No. 113123351 (with English Translation of Category of Cited Documents), 10 pages.

* cited by examiner

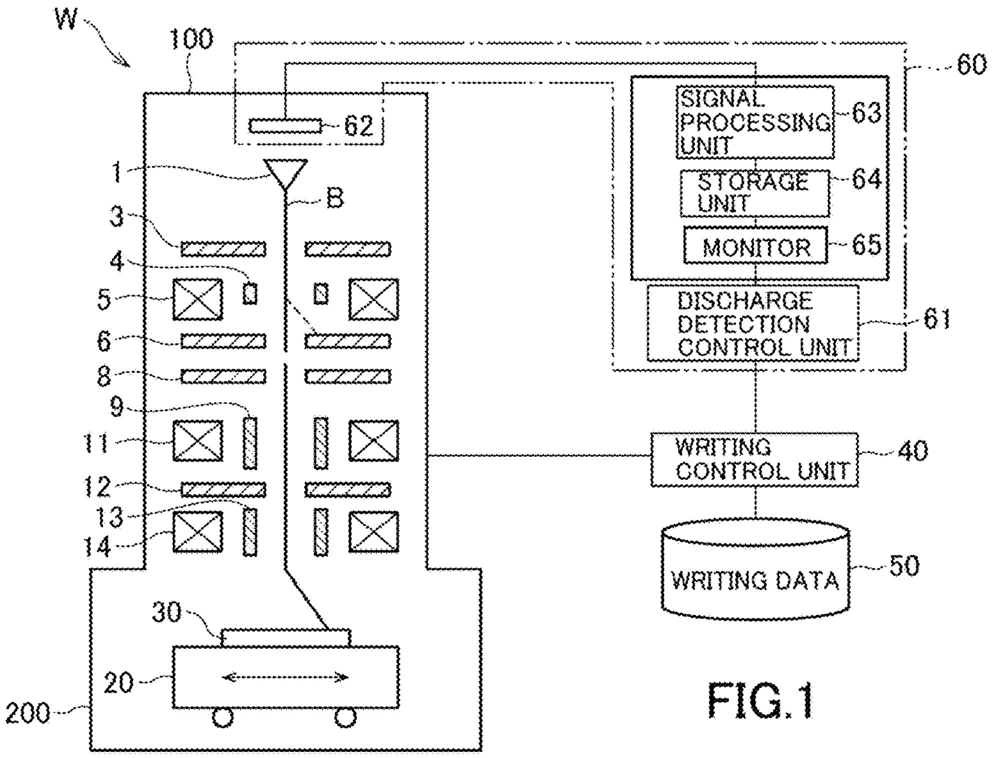
FIG.1
FIG.2
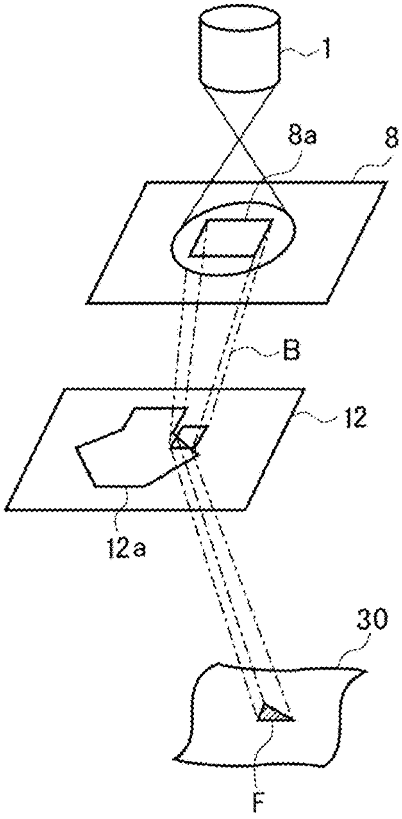

CHARGED PARTICLE BEAM WRITING APPARATUS, DISCHARGE DETECTION METHOD, AND DISCHARGE DETECTION APPARATUS

CROSS REFERENCE TO RELATED APPLICATION

This application is based upon and claims benefit of priority from the Japanese Patent Application No. 2023-120081, filed on Jul. 24, 2023, the entire contents of which are incorporated herein by reference.

FIELD

The present invention relates to a charged particle beam writing apparatus, a discharge detection method, and a discharge detection apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In electron beam writing apparatuses, abnormal discharges may occur due to dust adhered to components or column wall surfaces. When such an abnormal discharge occurs, there may be a case where a desired position is not irradiated with the electron beam due to its orbit being bent or pattern errors may occur due to the disappearance of the electron beam, which results in reduced writing accuracy.

A discharge detection apparatus is used to detect such discharges. The discharge detection apparatus includes, for example, an antenna, such as a metal plate, and an insulating member that holds the antenna inside the housing while electrically insulating the antenna from the housing. Changes in the electric field generated at the time of discharge affect the electric potential of the antenna, and voltage changes occur in the output of the discharge detection apparatus.

Hitherto, the output voltage of the discharge detection apparatus has been monitored, and when the output voltage becomes greater than or equal to a predetermined threshold value, the occurrence of a pattern error due to a discharge is reported, and writing processing is stopped. However, it has been difficult to determine whether or not a pattern error has actually occurred simply by comparing the output voltage with the threshold value.

For example, in a case where the time during which the output voltage is greater than or equal to the threshold value is extremely short, the writing processing may be stopped even though a pattern error has not actually occurred. Even when the output voltage is less than the threshold value, discharges may occur continuously for a long time, and pattern errors may occur. However, since the output voltage is less than the threshold value, there may be a case where the writing processing continues with a pattern error occurring, which may result in a decrease in yield.

BRIEF DESCRIPTION OF THE DRAWINGS

FIG. 1 is a schematic diagram of the configuration of an electron beam writing apparatus according to an embodiment of the present invention.

FIG. 2 is a schematic diagram for describing beam shaping.

DETAILED DESCRIPTION

Figure 3:
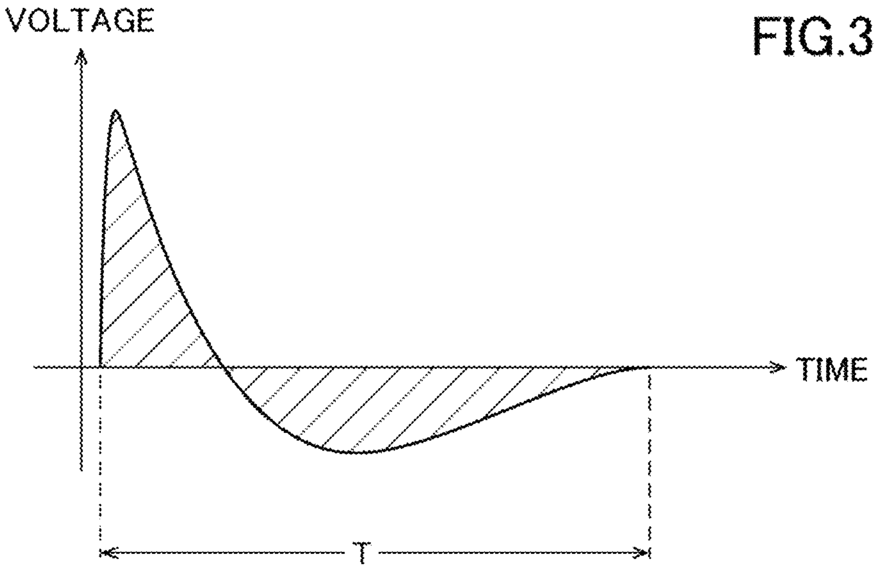
FIG. 3 is a diagram illustrating an example of the time integral of voltage.

In one embodiment, a charged particle beam writing apparatus includes an emission unit configured to emit a charged particle beam, a high-voltage power supply configured to apply an acceleration voltage for charged particles to the emission unit, a deflector configured to deflect the emitted charged particle beam, a stage configured to mount thereon a target object to be irradiated with the charged particle beam and to be written, a discharge sensor configured to output an output value indicating a change in a case where a discharge occurs in a column in which the emission unit and the deflector are arranged or in the high-voltage power supply, and a discharge detection control unit configured to convert the output value from the discharge sensor into a conversion value with the same sign, calculate an integral value of the conversion value over a fixed period of time, and determine, based on the integral value, whether or not a discharge that causes a pattern error has occurred.

In the following, an embodiment of the present invention will be described on the basis of the drawings. In the present embodiment, a configuration using an electron beam as an example of a charged particle beam will be described. Note that a charged particle beam is not limited to an electron beam and may also be, for example, an ion beam.

FIG. 1 is a schematic diagram of an electron beam writing apparatus according to an embodiment of the present invention. The electron beam writing apparatus illustrated in FIG. 1 is a variable-shaping-type writing apparatus including a writing unit W, a writing control unit 40, and a discharge detection unit 60.

The writing unit W has an electronic optical column 100, and a writing chamber 200. In the electronic optical column 100, an electron gun 1, a limiting aperture member 3, a blanker 4, an illumination lens 5, a blanking aperture 6, a first shaping aperture 8, a shaping deflector 9, a projection lens 11, a second shaping aperture 12, a deflector 13, an objective lens 14, and a sensor 62 are arranged.

In the writing chamber 200, an XY stage 20 is arranged. On the XY stage 20, a substrate 30, which is a writing target, is arranged. The substrate 30 is, for example, a mask substrate in which a metal light-shielding film, such as chrome, is provided on a quartz substrate and a resist is applied on the metal light-shielding film.

Excess electrons of an electron beam B emitted from the electron gun 1 (an emission unit) are cut off when the electron beam B passes through the limiting aperture member 3. When the electron beam B that has passed through the limiting aperture member 3 passes through the inside of the blanker 4 (a blanking deflector), the electron beam B is controlled by the blanker 4 so as to pass through the blanking aperture 6 in the beam-ON state and is deflected by the blanker 4 so that the entire beam is blocked by the blanking aperture 6 in the beam-OFF state. The electron beam B that passes through the blanking aperture 6 from the beam-OFF state to the beam-ON state and thereafter to the beam-OFF state corresponds to a single electron beam shot.

The blanker 4 controls the deflection of the electron beam B passing therethrough to generate the beam-ON state and the beam-OFF state in an alternating manner. For example, a deflection voltage is not applied to the blanker 4 in the beam-ON state, and the deflection voltage is applied to the blanker 4 when the beam is off. On the basis of the irradiation time of each shot, the irradiation dose of the electron beam B per shot is adjusted with which the substrate 30 is irradiated.

The entire first shaping aperture 8 having a rectangular opening 8*a* (refer to FIG. 2) is irradiated by the illumination lens 5 with each shot of the electron beam B generated by passing through the blanker 4 and the blanking aperture 6. The electron beam B is shaped to be rectangular by passing through the opening 8*a* of the first shaping aperture 8.

A first aperture image of the electron beam B that has passed through the first shaping aperture 8 is projected by the projection lens 11 onto the second shaping aperture 12 having an opening 12*a* (refer to FIG. 2). In that case, the first aperture image to be projected onto the second shaping aperture 12 is deflected and controlled by the shaping deflector 9, so that the shape and dimensions of the electron beam passing through the opening 12*a* can be changed (variable shaping can be performed).

A second aperture image of the electron beam B that has passed through the opening 12*a* of the second shaping aperture 12 is focused by the objective lens 14 and deflected by the deflector 13, and a target position of the substrate 30 arranged on the XY stage 20 is irradiated with the electron beam B. The deflector 13 may have a two-stage configuration including a main deflector and a sub-deflector or may have a three-stage configuration further including a sub-sub-deflector.

FIG. 2 is a schematic perspective view for describing beam shaping performed by the first shaping aperture 8 and the second shaping aperture 12. A rectangular (rectangular or square) opening 8*a* for shaping an electron beam B is formed in the first shaping aperture 8.

A variable shaping opening 12*a* for shaping the electron beam B having passed through the opening 8*a* of the first shaping aperture 8 into a desired shape is formed in the second shaping aperture 12. The variable shaping opening 12*a* has an octagonal shape formed by a hexagonal-shaped portion and a square-shaped portion connected to the hexagonal-shaped portion.

The electron beam B that has been emitted from the electron gun 1 and has passed through the opening 8*a* of the first shaping aperture 8 is deflected by the shaping deflector 9 and passes through the variable shaping opening 12*a* to be an electron beam of desired dimensions and a desired shape. The substrate 30 mounted on the XY stage 20 that continuously moves in a predetermined one direction (for example, the X direction) is irradiated with the electron beam of the desired dimensions and the desired shape that has passed through a portion of the variable shaping opening 12*a*. That is, a beam shape F that can pass through both the opening 8*a* of the first shaping aperture 8 and the variable shaping opening 12*a* of the second shaping aperture 12 is written in a writing region of the substrate 30 mounted on the XY stage 20 that continuously moves in the X direction.

In the example of FIG. 2, the electron beam B is first shaped into a rectangle by passing through the opening 8*a* of the first shaping aperture 8 and then into a shape whose cross-sectional shape perpendicular to the beam axis direction is a right isosceles triangle by passing through the variable shaping opening 12*a* of the second shaping aperture 12.

A storage device 50 stores writing data for writing patterns on the substrate 30. This writing data is data obtained by converting design data (layout data) into a format for the writing apparatus, and is input from an external device to the storage device 50 and stored.

The writing control unit 40 performs, for example, a multi-stage data conversion process on the writing data stored in the storage device 50, divides each shape pattern to be written into shot figures of a size for which irradiation is possible in a single shot, and generates shot data that is in a format specific to the writing apparatus. The shot data includes, for each shot, a figure code indicating the figure type of each shot graphic, a figure size, a shot position, and an irradiation time, for example. The generated shot data is temporarily stored in a memory (not illustrated).

The writing control unit 40 applies a deflection voltage to the blanker 4 so that irradiation is performed for the irradiation time set in the shot data. The writing control unit 40 applies a deflection voltage to the shaping deflector 9 so that the figure type and figure size set in the shot data are realized. The writing control unit 40 applies a deflection voltage to the deflector 13 so that the shot position set in the shot data is irradiated with the electron beam.

Scattered electrons are generated when the electron beam B collides with the shaping apertures or the like in the writing unit W, and this may cause insulators to be charged and discharged. For the purpose of detecting such discharges, the electron beam writing apparatus is provided with the discharge detection unit 60 (a discharge detection apparatus).

The discharge detection unit 60 includes, for example, a discharge detection control unit 61, the sensor 62, a signal processing unit 63, a storage unit 64, and a monitor 65. The discharge detection control unit 61 performs control regarding discharge detection.

The sensor 62 (a discharge sensor) is used as an antenna or an electrode. An antenna in this case refers to an antenna made of conductive material, such as metal that can capture electromagnetic waves or changes in electric or magnetic fields (electromagnetic noise) in space, convert the electromagnetic waves or changes into voltage or current signals, and output the signals. Such an antenna can capture signals regarding discharges. In the present embodiment, the sensor 62 is described as a metal plate; however, the shape of the sensor 62 is not limited to a plate shape and can be a cable or a single copper wire that is coiled.

The sensor 62 is provided, for example, near and above the electron gun 1 in the electronic optical column 100. The arrangement of the sensor 62 is not limited to this, and the sensor 62 can be arranged at any position in the housing of the electron beam writing apparatus as long as the sensor 62 is not in the path of the electron beam B.

The signal processing unit 63 is, for example, an oscilloscope, and is electrically connected to the sensor 62 and acquires signals regarding the sensor 62. The following is an example of a case where the signal processing unit 63 is an oscilloscope, but the signal processing unit 63 may be an ammeter or voltmeter, for example. The signal processing unit (a digitizer) 63, for example, acquires analog data of a current based on the electric potential of the sensor 62, performs analog-to-digital conversion processing on the analog data, and stores, in the storage unit 64, data generated through the processing (hereinafter also referred to as voltage data, which can be regarded as current value data obtained by changing resistance values). The voltage data represents, for example, the relationship between the output voltage of the sensor 62 and time.

The discharge detection control unit 61 reads out the voltage data stored in the storage unit 64, performs discharge detection processing to detect, on the basis of the voltage data, changes in the electric field originating from discharges, and stores the results of the processing in the storage unit 64. The results of the processing stored in the storage unit 64 are, for example, displayed on the monitor 65. Alternatively, the relationship between the voltage represented by the voltage data stored in the storage unit 64 and time may be displayed on the monitor 65. The discharge detection processing can be performed on the basis of the display on the monitor 65.

While the electron beam writing apparatus is performing writing processing on the substrate 30, the electron beam writing apparatus detects, using the discharge detection unit 60, discharges that cause writing pattern errors.

For example, the discharge detection control unit 61 constantly reads out the voltage data stored in the storage unit 64 at certain time intervals while writing is being performed, and detects, on the basis of the voltage data, discharges that may cause writing pattern errors.

For example, the discharge detection control unit 61 monitors voltage changes measured by the sensor 62 and calculates the time integral of the absolute value of voltage over a fixed period of time. In a case where the calculated integral value becomes greater than or equal to a predetermined value, the discharge detection control unit 61 determines that a discharge that causes a writing pattern error is detected. In contrast, in a case where the calculated integral value is less than the predetermined value, the discharge detection control unit 61 determines that a discharge that causes a writing pattern error is not detected.

The predetermined value (a threshold value) to be used for comparison with the integral value may be determined from several actual examples or may be determined by conducting experiments. In the experiments, discharges of various magnitudes are intentionally caused, the discharges are measured and recorded using sensors while detecting the electron beam with which irradiation is performed using a Faraday cup (not illustrated) provided on the XY stage 20, and the predetermined value may be determined on the basis of whether or not an increase or decrease in beam satisfies the desired accuracy.

FIG. 3 illustrates an example of a graph plotting voltage data. In the graph, the horizontal axis corresponds to time, and the vertical axis corresponds to the voltage measured by the sensor 62. The time integral of the absolute value of voltage over a fixed period of time T calculated by the discharge detection control unit 61 corresponds to the shaded portion of FIG. 3. In a case where the sensor 62 captures electromagnetic noise of a discharge with its antenna, the reference potential is the ground potential.

Figure 4:
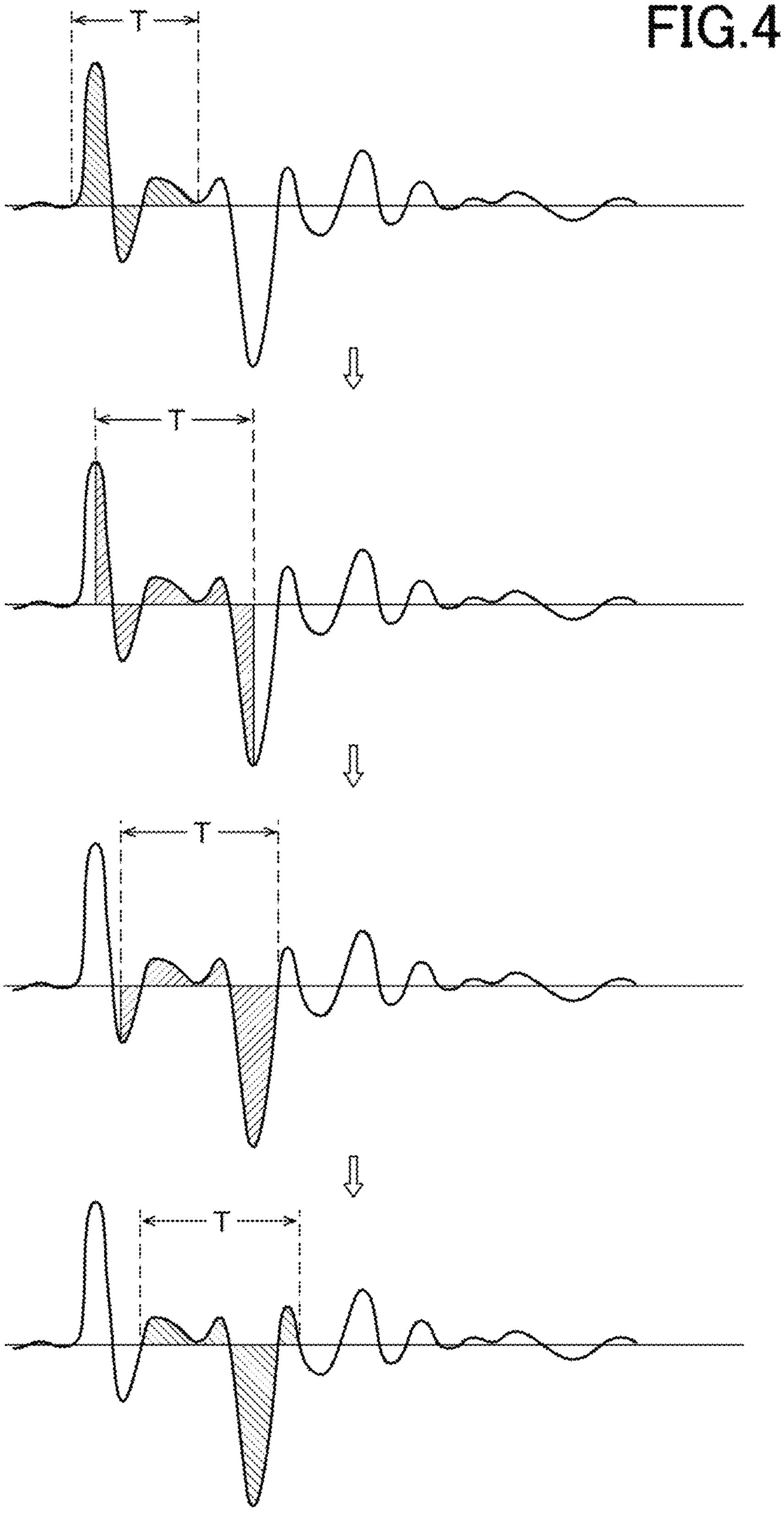
FIG. 4 is a diagram illustrating an example of the time integral of voltage.

The discharge detection control unit 61 continuously calculates the integral value of the absolute value of voltage while shifting the section to be integrated, as illustrated in FIG. 4.

In a case where the integral value becomes greater than or equal to the predetermined value, the writing control unit 40 stops the writing processing or issues a warning. After the writing processing is stopped, the substrate 30 can be taken outside, the resist can be removed, and the substrate 30 can be used again for the writing processing.

Figure 5A:
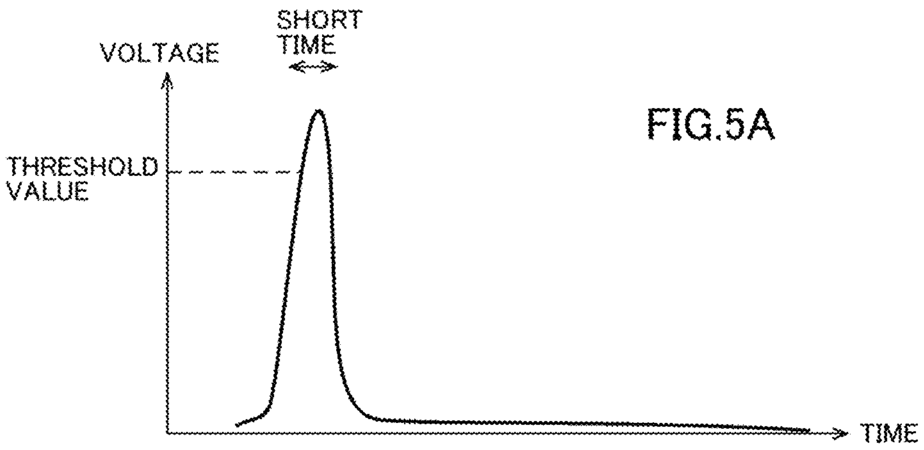
FIGS. 5A and 5B are diagrams for describing an existing discharge detection method.

In an existing discharge detection method, in which the voltage measured by the sensor 62 is compared with a threshold value, as illustrated in FIG. 5A, in a case where the time during which the voltage is greater than or equal to the threshold value is extremely short, a pattern error may be determined to have occurred and the writing processing may be stopped even though a pattern error has not actually occurred. In contrast, since the integral value of the absolute value of voltage is obtained in the present embodiment, it can be determined in the case of the pattern of voltage changes as illustrated in FIG. 5A that a discharge that causes a writing pattern error is not detected, which enables the writing processing to continue and false detection to be suppressed.

Figure 5B:
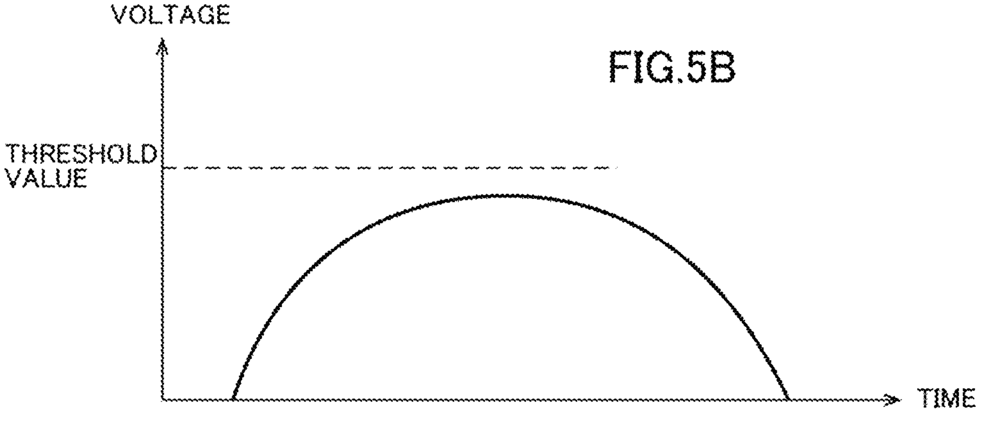

In the existing discharge detection method, in which the voltage measured by the sensor 62 is compared with the threshold value, as illustrated in FIG. 5B, in a case where the voltage is less than the threshold value but the voltage remains somewhat high for a long time and a pattern error occurs, there may be a case where a discharge is not detected and the writing processing continues with the pattern error occurring, which may result in a decrease in yield. For example, in a case where n-times (for example, 4-times) multiple writing is to be performed on one irradiation region, even when a voltage change (an amplitude) due to a discharge does not cause a pattern error in one shot, a pattern error may occur when this voltage change lasts long and each shot up to n shots is in the duration of this voltage change. In contrast, since the integral value of the absolute value of voltage is obtained in the present embodiment, it can be determined in the case of the pattern of voltage changes as illustrated in FIG. 5B that a discharge that causes a writing pattern error has occurred, so that writing processing can be stopped.

Furthermore, for example, depending on a high-voltage power supply used to apply an acceleration voltage to the electron gun 1, the stray capacitance and series impedance of the electron gun 1, and the operation of the voltage stabilization circuit in the high-voltage power supply, there may be a case where, as illustrated in FIG. 3, the voltage changes due to a discharge are not in a constant direction but vary in both positive and negative directions. In an existing discharge detection method, in which the time integral value of voltage measured by the sensor 62 is compared with a threshold value, when the voltage changes are not in a constant direction but vary in both positive and negative directions, as illustrated in FIG. 3, and the time integral value of positive change and that of negative change are close to each other, the time integral value becomes small even though the voltage fluctuation is large and the time of voltage fluctuation is long, and thus there may be a case where a discharge is not detected and the writing processing continues with a pattern error occurring, which may result in a decrease in yield. In contrast, since the integral value of the absolute value of voltage is obtained in the present embodiment, it can be determined in the case of the pattern of voltage changes as illustrated in FIG. 3 that a discharge that causes a writing pattern error has occurred, so that the writing processing can be stopped.

In this manner, according to the present embodiment, discharges that cause pattern errors can be accurately detected.

In the above-described embodiment, the configuration that continuously calculates the time integral of the absolute value of voltage over the fixed period of time T has been described. This configuration requires a plurality of digitizers or a complex digitizer and constant calculations. Thus, only in a case where the voltage (or the absolute value of the voltage) measured by the sensor 62 becomes greater than or equal to the predetermined reference value, the voltage data over a fixed period of time T thereafter may be recorded, the time integral of the absolute value of voltage over the fixed period of time T may be calculated, and it may be determined on the basis of the integral value whether or not a discharge that causes a writing pattern error has occurred. This greatly reduces the cost of calculating the integral value since one digitizer for each sensor or a simple digitizer is sufficient, and the calculation does not need to be performed constantly.

In the above-described embodiment, the configuration in which the sensor 62 that captures changes in the electric or magnetic field due to discharges is used as a discharge sensor has been described; however, various sensors that measure physical quantities that change due to discharges can be used. For example, an optical sensor that converts light emitted by a discharge into an electrical signal may be used as a discharge sensor. Since the voltage value and current value of the high-voltage power supply (not illustrated) that applies high voltage to the electron gun 1 change due to discharges, a sensor that monitors this voltage value and this current value may be used as a discharge sensor. A sensor that monitors changes in beam current on the side closer to the electron gun 1 than to the blanker 4 may be used as a discharge sensor.

Depending on the type of discharge sensor used, the duration of the integration process (the time T in FIG. 3) and the predetermined value (the threshold value) to be compared with the integral value are determined as appropriate.

The discharge detection control unit 61 may identify the cause of a discharge from the waveform pattern of voltage changes. Maintenance may also be performed in accordance with the identified cause.

The above-described embodiment describes an example of a writing apparatus using a single beam but may also be applied to a writing apparatus using multiple beams.

The discharge detection unit 60 (the discharge detection apparatus) can be applied not only to writing apparatuses but also to other apparatuses in which discharges occur within the housings. The discharge detection unit 60 monitors voltage changes measured by the sensor 62, calculates the time integral of the absolute value of voltage over a fixed period of time, and determines, on the basis of the integral value, whether or not an error affecting the processing of the apparatus has occurred.

In the above-described embodiment, the example has been described in which a discharge sensor (a first discharge sensor) of the discharge detection unit is installed in the electronic optical column 100 to detect discharges that occur in the electronic optical column 100. However, a discharge sensor (a second discharge sensor) may be installed in the high-voltage power supply that is connected to the cathode of the electron gun 1 (the emission unit) and applies an electron acceleration voltage, and discharges occurring in the high-voltage power supply may be detected. In this case, the circuit that extracts change amounts (ripples) in the output voltage or output current of the high-voltage power supply has the function of a discharge sensor. The discharge detection control unit 61 calculates the integral value of the absolute value of the output from the ripple extraction circuit over a fixed period of time, and in a case where the calculated integral value becomes greater than or equal to the predetermined value, the discharge detection control unit 61 determines that a discharge that causes a writing pattern error is detected. The discharge sensor is preferably installed in both the electronic optical column 100 and the high-voltage power supply, but may be installed in only one of the electronic optical column 100 and the high-voltage power supply.

In the above-described embodiment, the example of calculating the integral value of the absolute value of the output voltage of the discharge sensor over a fixed period of time has been described, but values to be integrated are not limited to absolute values. It is sufficient that the output voltage of the discharge sensor be converted into a discharge intensity signal that always has the same sign, and the converted value be integrated. For example, the square value of the output voltage of the discharge sensor may be integrated.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:

an emission unit configured to emit a charged particle beam;

a high-voltage power supply configured to apply an acceleration voltage for charged particles to the emission unit;

a deflector configured to deflect the emitted charged particle beam;

a stage configured to mount thereon a target object to be irradiated with the charged particle beam and to be written;

a discharge sensor configured to output an output value indicating a change in a case where a discharge occurs in a column in which the emission unit and the deflector are arranged or in the high-voltage power supply; and a discharge detection control unit configured to convert the output value from the discharge sensor into a conversion value with the same sign, calculate an integral value of the conversion value over a fixed period of time, and determine, based on the integral value, whether or not a discharge that causes a pattern error has occurred.

2. The apparatus according to claim 1, further comprising a writing control unit configured to perform controls to stop pattern writing processing in a case where the discharge detection control unit has determined that a discharge that causes a pattern error has occurred.

3. The apparatus according to claim 1, wherein in a case where the output value becomes greater than or equal to a predetermined reference value, the discharge detection control unit records the output value over the fixed period of time and calculates the integral value.

4. The apparatus according to claim 1, wherein the discharge sensor is a sensor detecting electromagnetic noise of a discharge occurring in the column or a sensor detecting light emitted by a discharge.

5. The apparatus according to claim 1, wherein the discharge sensor is a circuit extracting a change amount in an output voltage or current of the high-voltage power supply.

6. The apparatus according to claim 1, wherein the discharge sensor includes a first discharge sensor which outputs an output value indicating a change in a case where a discharge occurs in the column, and a second discharge sensor which outputs an output value indicating a change in a case where a discharge occurs in the high-voltage power supply.

7. The apparatus according to claim 1, wherein the discharge sensor is arranged above the emission unit.

8. The apparatus according to claim 1, wherein the discharge detection control unit identifies a cause of a discharge from a waveform of changes in the output value from the discharge sensor.

9. A discharge detection method comprising:

applying, using a high-voltage power supply, an acceleration voltage for charged particles to an emission unit in a column, emitting a charged particle beam from the emission unit, and writing a pattern on a target object;

acquiring an output value from a discharge sensor which outputs an output value indicating a change in a case where a discharge occurs in the column or in the high-voltage power supply;

converting the output value into a conversion value with the same sign, and calculating an integral value of the conversion value over a fixed period of time; and determining, based on the integral value, whether or not a discharge that causes a pattern error has occurred.

10. The method according to claim 9, wherein the pattern writing processing is stopped in a case where a discharge that causes a pattern error has been determined to have occurred.

11. The method according to claim 9, wherein in a case where the output value becomes greater than or equal to a predetermined reference value, the output value over the fixed period of time is recorded to calculate the integral value.

12. The method according to claim 9, wherein the discharge sensor detects electromagnetic noise of a discharge occurring in the column or light emitted by a discharge.

13. A discharge detection apparatus comprising:

a discharge sensor configured to output an output value indicating a change in a case where a discharge occurs; and a discharge detection control unit configured to convert the output value from the discharge sensor into a conversion value with the same sign, calculate an integral value of the conversion value over a fixed period of time, and determine, based on the integral value, whether or not a discharge that causes an error has occurred.

14. The apparatus according to claim 13, wherein in a case where the output value becomes greater than or equal to a predetermined reference value, the discharge detection control unit records the output value over the fixed period of time and calculates the integral value.

* * * * *